United States Patent
Ogasawara et al.

(10) Patent No.: US 8,660,223 B2
(45) Date of Patent: Feb. 25, 2014

(54) PLL CIRCUIT, COMMUNICATION DEVICE, AND LOOPBACK TEST METHOD OF COMMUNICATION DEVICE

(75) Inventors: Kazuo Ogasawara, Kanagawa (JP); Masao Nakadaira, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/556,752

(22) Filed: Jul. 24, 2012

(65) Prior Publication Data

US 2012/0287967 A1 Nov. 15, 2012

Related U.S. Application Data

(63) Continuation of application No. 12/500,063, filed on Jul. 9, 2009, now Pat. No. 8,270,553.

(30) Foreign Application Priority Data

Jul. 30, 2008 (JP) ................................. 2008-196774

(51) Int. Cl.
*H03D 3/24* (2006.01)
(52) U.S. Cl.
USPC ....................................................... 375/346
(58) Field of Classification Search
USPC ......... 375/130, 219, 224, 225, 259, 296, 308, 375/327, 334, 354, 362, 376, 377; 327/105, 327/147, 156, 158, 161, 245
See application file for complete search history.

(56) References Cited

U.S. PATENT DOCUMENTS

| 4,789,996 | A | 12/1988 | Butcher |
| 6,888,412 | B2 | 5/2005 | Kim et al. |
| 7,215,165 | B2 | 5/2007 | Yamamoto et al. |
| 7,236,039 | B2 | 6/2007 | Ogasawara |
| 2003/0058053 | A1* | 3/2003 | Jeon et al. ........................ 331/17 |
| 2004/0250180 | A1* | 12/2004 | Hotta ............................. 714/699 |

(Continued)

FOREIGN PATENT DOCUMENTS

| CN | 1815892 | 8/2006 |
| EP | 1693967 | 8/2006 |

(Continued)

OTHER PUBLICATIONS

Japanese Patent Office issued a Japanese Office Action dated Apr. 13, 2010, Application No. 2008-196774.

(Continued)

*Primary Examiner* — Sam K Ahn
*Assistant Examiner* — Syed Haider
(74) *Attorney, Agent, or Firm* — Young & Thompson

(57) ABSTRACT

A controlling unit disposed in a PLL circuit controls a phase interpolator to gradually change a phase shift amount applied to a phase shift signal C_PS by a unit of basic delay amount Δ at a timing predetermined in accordance with a modulation profile of an SSC. Further, the controlling unit controls a total phase shift amount applied to the phase shift signal C_PS output from the phase interpolator in one period of a feedback clock signal C_FB obtained by dividing frequency of the phase shift signal C_PS in a way that a difference between the total phase shift amount and a total phase shift amount in a previous one period of C_FB is always equal to or less than the basic delay amount Δ.

13 Claims, 8 Drawing Sheets

(56) References Cited

U.S. PATENT DOCUMENTS

| | | |
|---|---|---|
| 2004/0257124 A1 | 12/2004 | Araki et al. |
| 2005/0289379 A1 | 12/2005 | Teutsch et al. |
| 2006/0076997 A1* | 4/2006 | Ogasawara ................ 327/291 |
| 2006/0290393 A1 | 12/2006 | Yamamoto et al. |
| 2007/0189360 A1* | 8/2007 | Mobin et al. ................ 375/130 |
| 2008/0260071 A1* | 10/2008 | Sidiropoulos et al. ........ 375/334 |
| 2009/0141774 A1 | 6/2009 | Araki et al. |

FOREIGN PATENT DOCUMENTS

| | | |
|---|---|---|
| JP | 2003-124805 | 4/2003 |
| JP | 2005-070960 | 3/2005 |
| JP | 2006-166049 | 6/2006 |
| JP | 2006-211479 | 8/2006 |
| JP | 2007-006121 | 1/2007 |
| JP | 4074166 | 2/2008 |
| KR | 2005-0000335 | 1/2005 |
| KR | 2007-0060456 | 6/2007 |

OTHER PUBLICATIONS

Korean Official Action—2009-0055373—Dec. 22, 2010.

Chinese Office Action dated Aug. 9, 2012 in corresponding Chinese Application No. 200910140151.6 with English translation of Chinese Office Action.

\* cited by examiner

PLL CIRCUIT, COMMUNICATION DEVICE, AND LOOPBACK TEST METHOD OF COMMUNICATION DEVICE

CROSS REFERENCE TO RELATED APPLICATIONS

This application is a continuation of co-pending application Ser. No. 12/500,063 filed on Jul. 9, 2009, which claims foreign priority to Japanese Application No. 2008-196774 filed on Jul. 30, 2008. The entire content of each of these applications is hereby expressly incorporated by reference.

BACKGROUND OF THE INVENTION

1. Field of the Invention

The present invention relates to a PLL (Phase Locked Loop) circuit that generates a spread spectrum clock, and a communication device using the same.

2. Description of Related Art

A spread spectrum clock (SSC) signal has been generally employed in order to suppress occurrence of EMI (Electro Magnetic Interference) by electronic devices. For example, an SSC is generated by modulating frequency of a clock signal generated by a PLL circuit or the like in accordance with a predetermined modulation frequency and modulation degree. Patent documents 1 to 5 listed below disclose a device that generates an SSC.

Patent document 1: Japanese Unexamined Patent Application Publication No. 2006-166049

Patent document 2: U.S. Pat. No. 6,888,412

Patent document 3: Japanese Patent No. 4074166

Patent document 4: Japanese Unexamined Patent Application Publication No. 2007-6121

Patent document 5: Japanese Unexamined Patent Application Publication No. 2006-211479

An SSC generation device disclosed in the patent document 1 generates, by means of a phase interpolator, a frequency-modulated SSC by advancing or retarding phase of an output clock signal that is generated by a clock generating circuit such as a PLL circuit or the like.

On the other hand, the patent documents 2 to 5 disclose a PLL circuit that includes an SSC generation function. Among them, a PLL circuit disclosed in the patent documents 2 and 3 includes a phase interpolator arranged on a feedback path that supplies an output clock signal of a voltage controlled oscillator (VCO) to a phase comparator or a phase and frequency comparator for phase comparison with a reference signal. An output clock signal of a VCO is frequency-modulated by periodically advancing or retarding the phase of the output clock signal by the phase interpolator, to thereby obtain the SSC. Further, a PLL circuit disclosed in the patent document 4 generates an SSC by periodically changing a delay amount applied to a feedback clock signal by a delay circuit arranged on a feedback path of the PLL circuit. Further, a PLL circuit disclosed in the patent document 5 generates an SSC by periodically changing a frequency dividing ratio of a frequency divider arranged on a feedback path of the PLL circuit.

When the output of the clock generating circuit is frequency-modulated by the method disclosed in the patent document 1, a jitter of the SSC tends to be made large because a high frequency jitter component that is produced by phase control of the phase interpolator is superimposed on the SSC. On the other hand, the PLL circuit disclosed in the patent documents 2 and 3 periodically increases or decreases the control voltage of the VCO by arranging the phase interpolator, which is the component for performing frequency modulation, on the feedback path, and frequency-modulates the output clock signal of the VCO by the control voltage that is periodically fluctuated. Accordingly, as the high frequency jitter component that is produced by phase control of the phase interpolator decays by closed loop frequency characteristics (low-pass filter characteristics) of the PLL, the PLL circuit disclosed in the patent documents 2 and 3 may improve the jitter characteristics of the SSC.

SUMMARY

In a general PLL circuit, in order to suppress frequency of a reference clock signal, frequency of an output clock signal of a VCO is divided by a frequency divider, and thereafter the divided clock signal is fed back to a phase comparator. Hereinafter, the output clock signal after being subjected to the frequency division that is fed back to the phase comparator will be referred to as "feedback clock signal".

Now, the present inventors have found a problem as follows. That is, when the phase of the feedback clock signal is changed in order to change the modulation degree of the SSC as in the PLL circuit disclosed in the patent documents 2 and 3, the jitter of the output of the VCO, which is the jitter of the SSC, cannot be sufficiently suppressed due to a transient response of the PLL unless the phase change amount of the feedback clock is appropriately controlled.

The patent document 2 discloses a technique of (1) inserting a phase interpolator on a PLL feedback path and generating n clock signals CLK0 to CLK(n−1) that are phase-shifted from an output clock signal of a VCO by phase shift amounts that are mutually different from each other, and (2) selecting one of n clock signals CLK0 to CLK(n−1) in an increasing order or a decreasing order to supply it to a phase comparator. However, the patent document 2 dose not disclose the configuration in which a phase-shifted clock signal is fed back to a phase comparator through a frequency divider, and there is no suggestion to solve the above-described problem.

Further, the patent document 3 discloses the configuration in which phase of an output clock signal of a VCO is periodically changed by a phase interpolator and a feedback clock signal obtained by dividing frequency of a phase-shifted clock signal is supplied to a phase comparator. However, as will be clear from a modulation waveform shown in FIG. 16 and the description of the patent document 3, the PLL 110 circuit disclosed in the patent document 3 increases or decreases a total phase shift amount applied to a feedback clock signal in one period of the feedback clock signal by 1 Δ (1 dt in the patent document 3) or 2 Δ compared with a total phase shift amount in a previous one period. In such a control of the phase shift amount, a jitter of the SSC may not be completely suppressed due to the influence of the transient response of the PLL. Note that Δ is a basic delay amount of a phase interpolator (basic delay time in the patent document 3). The basic delay amount corresponds to a minimum time difference between n clock signals generated by the phase interpolator. Accordingly, "phase shift amount" used in the description has a time dimension.

A first exemplary aspect of the present invention is a PLL circuit that generates a spread spectrum clock (SSC). The PLL circuit includes a phase comparing unit, a voltage controlled oscillator (VCO), a phase interpolator, a frequency-dividing circuit, and a controlling unit. The phase comparing unit receives a reference clock signal and a feedback clock signal and generates a control voltage in accordance with a phase difference between the reference clock signal and the feedback clock signal. The VCO at an oscillation frequency in accordance with the control voltage generates an output clock signal as the SSC. The phase interpolator generates a phase-shifted signal obtained by shifting phase of the output clock signal by a phase shift amount selected from plurality of phase shift amounts mutually different by integral multiple of a basic delay amount. The frequency-dividing circuit generates the feedback clock signal by dividing frequency of the phase-shifted signal to supply the feedback clock signal to the phase comparator. The controlling unit controls the phase interpolator to gradually change a phase shift amount applied to the phase-shifted signal by a unit of the basic delay amount at a timing predetermined in accordance with a modulation profile of the SSC. Further, the controlling unit controls a total phase shift amount applied to the phase-shifted signal in one period of the feedback clock signal in a way that a difference between the total phase shift amount and a total phase shift amount in a previous one period of the feedback clock signal is always equal to or less than one basic delay amount.

In the PLL circuit according to the first exemplary aspect of the present invention, in generating the feedback clock signal by dividing the frequency of the output clock signal, a phase step width generated in the feedback clock (difference between a total phase shift amount in one period of the feedback clock and a total phase shift amount in a previous one period) can be suppressed to be equal to or less than one basic delay amount. Thus, a smooth transition of the modulation degree of the SSC is made possible while suppressing the jitter of the SSC.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

The specific exemplary embodiments to which the present invention is applied will be described in detail with reference to the accompanying drawings. The same components throughout the drawings are denoted by the same reference symbols, and the overlapping description will be omitted as appropriate for the sake of clarity.

First Exemplary Embodiment

Figure 1:
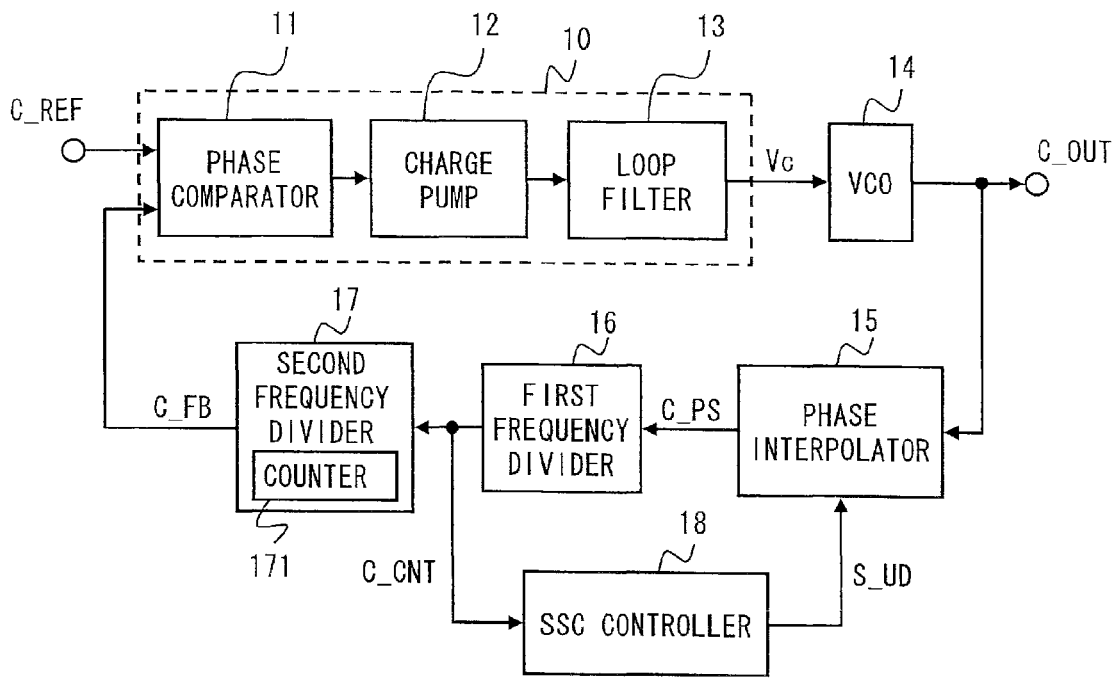
FIG. 1 is a block diagram of a PLL circuit according to a first exemplary embodiment of the present invention.

FIG. 1 is a block diagram showing the configuration of a PLL circuit 1 according to the first exemplary embodiment. The operation of the PLL circuit 1 to generate a spread spectrum output clock signal C_OUT will now be described. The PLL circuit 1 periodically increases or decreases a phase difference between a reference clock signal C_REF and a feedback clock signal C_FB input to a phase comparing unit 10 by advancing or retarding phase of the output clock signal C_OUT of a VCO 14 by a phase interpolator 15 that is arranged on a feedback path. In accordance with this periodical fluctuation of the phase difference, a control voltage Vc supplied from the phase comparing unit 10 to the VCO 14 periodically increases or decreases, and the output clock signal C_OUT is frequency-modulated. In the following description, each component shown in FIG. 1 will be described.

The phase comparing unit 10 receives C_REF and C_FB, and generates a control voltage Vc in accordance with the phase difference between C_REF and C_FB. In the configuration example of FIG. 1, the phase comparing unit 10 includes a phase comparator 11, a charge pump 12, and a loop filter 13. The phase comparator 11 generates a phase difference signal indicating the phase difference between C_REF and C_FB. Note that the phase comparator 11 may be a phase and frequency comparator that is able to pull the frequency. The charge pump 12 operates in accordance with the phase difference signal, and supplies electric charge to the loop filter 13 or drains electric charge from the loop filter 13. The loop filter 13 integrates the electric charge (current) supplied from the charge pump 12 to generate the control voltage Vc.

The voltage controlled oscillator (VCO) 14 oscillates at an oscillation frequency in accordance with the control voltage Vc, and generates an output clock signal C_OUT. The frequency of the output clock signal C_OUT of the VCO 14 is modulated as the control voltage Vc that periodically repeats increase and decrease in accordance with the fluctuation of the phase difference between C_REF and C_FB is supplied to the VCO 14.

The phase interpolator 15 receives the output clock signal C_OUT that is output from the VCO 14, and shifts the phase of C_OUT by a phase shift amount selected from among Nr phase shift amounts $\Delta P0$ to $\Delta P(Nr-1)$ mutually different by integral multiple of a basic delay amount $\Delta$. Then, the phase interpolator 15 supplies a phase-shifted clock signal (hereinafter referred to as phase shift signal) C_PS to a first frequency divider 16. Now, the basic delay amount $\Delta$ is a value (T_OUT/Nr) obtained by dividing the period T_OUT of the output clock signal C_OUT by Nr. In short, the basic delay amount $\Delta$ corresponds to a phase resolution of the phase interpolator 15.

Further, the phase interpolator 15 operates in accordance with a control signal S_UD supplied from an SSC controller 18. The control signal S_UD is a signal that indicates the phase shift amount that should be applied to C_OUT. For example, the control signal S_UD may be a digital signal that indicates the phase shift amount by its signal value. Alternatively, the control signal S_UD may be a pulse signal. In this case, the phase shift amount may be represented by the number of pulses or pulse width.

When the control signal S_UD is an UP signal indicating that the phase is advanced, the phase interpolator 15 advances the phase of the phase shift signal C_PS. When the phase of the phase shift signal C_PS is advanced, the phase of the feedback clock signal C_FB is also advanced. Accordingly, the phase comparing unit 10 judges that the oscillation frequency of the VCO 14 is higher than the frequency of the reference clock signal C_REF (hereinafter referred to as reference clock frequency) F_REF, so as to decrease the control voltage Vc. As such, the oscillation frequency of the VCO 14 decreases, and a down-spread SSC is generated. On the other hand, when the control signal S_UD is a DOWN signal indicating that the phase is retarded, the phase interpolator 15 retards the phase of the phase shift signal C_PS. When the phase of the phase shift signal C_PS is retarded, the phase of the feedback clock signal C_FB is also retarded. Accordingly, the phase comparing unit 10 judges that the oscillation frequency of the VCO 14 is lower than the reference clock frequency F_REF, so as to increase the control voltage Vc. As such, the oscillation frequency of the VCO 14 increases, and an up-spread SSC is generated.

The specific configuration of the phase interpolator 15 may be any known one. For example, the configuration disclosed in FIG. 10 or 11 of the patent document 1 may be applied to the phase interpolator 15. Further, as disclosed in the patent documents 2 and 3, the VCO 14 may be formed as a ring oscillator to generate Nr clock signals C0 to C(Nr−1) having mutually different phases. In this case, the phase interpolator 15 may select one clock signal from among the Nr clock signals C0 to C(Nr−1) generated by the VCO 14 in accordance with the control signal S_UD. The first frequency divider 16 and a second frequency divider 17 divide frequency of the phase shift signal C_PS to generate the feedback clock signal C_FB. More specifically, the first frequency divider 16 divides frequency of the phase shift signal C_PS to generate a control clock signal C_CNT. The second frequency divider 17 further divides frequency of the control clock signal C_CNT to generate a feedback clock signal C_FB. Accordingly, when a frequency division number of the first frequency divider 16 is "m" and a frequency division number of the second frequency divider 17 is "n", the period of the feedback clock signal C_FB is "m×n" times larger than the period of the phase shift signal C_PS.

The SSC controller 18 generates the control signal S_UD in accordance with a predetermined SSC modulation profile in order to control the phase shift operation by the phase interpolator 15. Note that the SSC modulation profile includes a modulation frequency F_SSC and a maximum modulation degree D_SSC, for example, and defines a spectrum and a waveform of the output clock signal C_OUT. Note that an indication frequency of UP/DOWN by the control signal S_UD is determined in accordance with the frequency division number m×n of the frequency dividers 16 and 17. This is because, as will be described later, the indication of UP/DOWN by the SSC controller 18 is determined based on a period T_FB of the feedback clock signal C_FB. The period T_FB is defined by the frequency division number m×n.

The SSC controller 18 controls the total phase shift amount applied to the phase shift signal C_PS in one period T_FB of the feedback clock signal C_FB so that the difference between this total phase shift amount and a total phase shift 320 amount of a previous one period is always equal to or below the basic delay amount Δ. To be more specific, when the total phase shift amount applied to the phase shift signal C_PS in one period T_FB(j) is equal to 11 basic delay amounts (11 Δ), a total phase shift amount applied to the phase shift signal C_PS in the next one period T_FB(j+1) is made equal to 12 or 10 basic delay amounts (12 Δ or 10 Δ).

Figure 2:
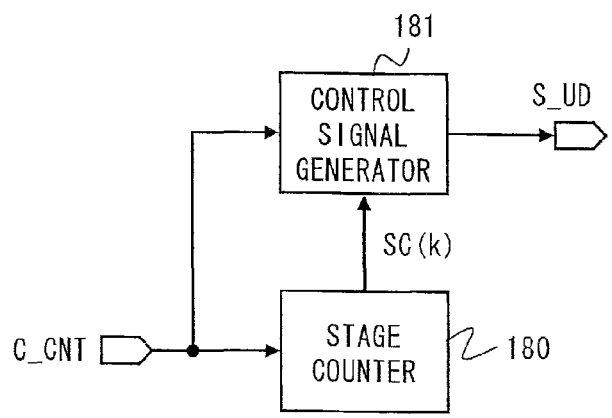
FIG. 2 is a block diagram showing a configuration example of an SSC controller included in the PLL circuit shown in FIG. 1.

In the following description, the configuration example of the SSC controller 18 will be described. FIG. 2 shows the configuration example of the SSC controller 18. In FIG. 2, a stage counter 180 is a counter that counts the number of pulses of the control clock signal C_CNT and outputs the current stage number SC(k). The stage counter 180 increases or decreases the stage number SC(k) by one when the number of pulses of the control clock signal C_CNT has reached a predefined number.

The stage here means a period in which one modulation degree is applied for the output clock signal C_OUT, and the modulation degree of the output clock signal C_OUT is revised for each stage. In other words, the modulation frequency F_SSC of the output clock signal C_OUT is defined according to the duration time of one stage and the total number of stages. For example, when the duration time of one stage is 30 times longer than the period of the feedback clock signal C_FB (hereinafter referred to as feedback clock period) T_FB and the frequency division number n of the second frequency divider 17 is 10, the stage counter 180 may increase or decrease the stage number SC(k) by one every time the control clock signal C_CNT is counted for 300 pulses.

The control signal generator 181 receives the stage number SC(k) from the stage counter 180 and outputs the control signal S_UD indicating the phase shift amount in accordance with the stage number SC(k). As is similar to the example above, considering a case in which the frequency division number n of the second frequency divider 17 is 10, the feedback clock period T_FB is ten times longer than the period T_CNT of the control clock signal C_CNT. Accordingly, in this case, the control signal generator 181 may output the control signal S_UD indicating the phase shift amount in accordance with the stage number SC(k) for each ten pulses of the control clock signal C_CNT.

By the way, frequency dividers may be generally formed with a counter. A frequency divider using the counter counts the number of pulses of the input clock signal by the counter to reset the counter value and output the pulse signal as the counter value reaches the predetermined number in accordance with the frequency division number. Thus, the counter value of a counter 171 embedded in the second frequency divider 17 may be supplied to the SSC controller 18. As such, the size of the circuit of the SSC controller 18 may be reduced. However, this circuit configuration is only available when the reset periods of the SSC controller 18 and the counter 171 embedded in the second frequency divider 17 are synchronized with each other.

Further, if the SSC controller 18 is able to deal with a high-frequency clock, the first frequency divider 16 may be omitted to operate the SSC controller 18 by the phase shift signal C_PS.

Now, the operation of the PLL circuit 1 will be described with reference to a timing chart of FIG. 3. Note 380 that, in the description regarding FIG. 3, the following values will be used as the specific example of each parameter.

Reference clock frequency (F_REF): 30 MHz
Reference clock period (T_REF): 33.33 ns
Reference frequency of output clock (F_OUT0): 1.5 GHz
SSC modulation frequency (F_SSC): 32.15 kHz
SSC modulation period (T_SSC): 32 μs
SSC maximum modulation degree (D_SSC): −5000 ppm
One stage period: 1 μs=30×T_REF
Resolution of phase interpolator 15 (Nr): 64
Frequency division number of first frequency divider 16 (m): 5

Frequency division number of second frequency divider 17 (n): 10

Figure 3:
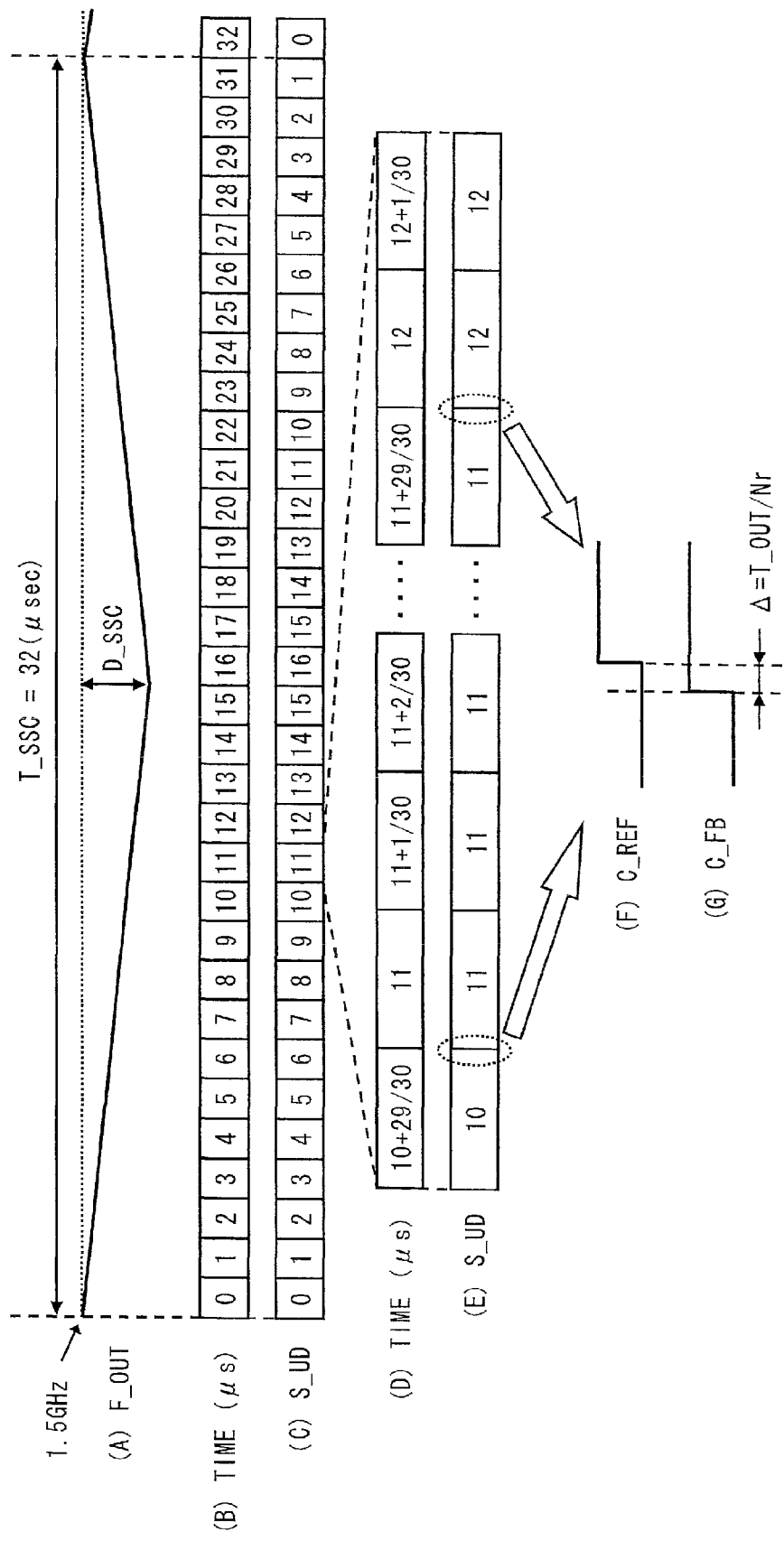
FIG. 3 shows a timing chart regarding the PLL circuit shown in FIG. 1.

A waveform (A) shown in FIG. 3 shows output clock frequency F_OUT, which is the frequency of the output clock signal C_OUT. Part (B) in FIG. 3 shows time in a microsecond unit in accordance with the stage period. One microsecond, which is one stage period, is 30 times larger than the feedback clock period T_FB. In other words, one stage period includes 30 pulses of the feedback clock signal C_FB.

In the example of FIG. 3A to 3G, the phase shift amount in the 16-th stage where the modulation degree is maximum is 16 times (16 Δ) as large as the basic delay amount Δ. In this stage, the phase of the phase shift signal C_PS is advanced by 16/Nr for every feedback clock period T_FB, or every 50 pulses of the phase shift signal C_PS. Accordingly, the modulation degree in the 16-th stage is, as shown in the expression (1) below, −5000 ppm. Part (C) in FIG. 3 shows the phase shift amount (number of UP/down) for each stage 410 designated by the control signal S_UD.

$$-\frac{1}{m \times n} \times \frac{16}{Nr} = -\frac{1}{50} \times \frac{16}{64} = -0.005 = -5000 \text{ ppm} \quad (1)$$

In the first exemplary embodiment, when the modulation degree of the output clock signal C_OUT is revised, the SSC controller 18 suppresses the maximum value of the phase step 415 width generated in the feedback clock signal C_FB to one basic delay amount Δ. To be more specific, the SSC controller 18 controls the difference between the total phase shift amount applied to the phase shift signal C_PS within ten-pulse period of the control clock signal C_CNT and the total phase shift amount applied to the phase shift signal C_PS within the previous ten-pulse period to be 1 Δ or zero. Note that the ten-pulse period of the control clock signal C_CNT corresponds to one pulse period (one period T_FB) of the feedback clock signal C_FB.

Further, parts (D) and (E) in FIG. 3 show an enlarged view of the control signal S_UD (part (C) in FIG. 3) around tenth to twelfth stages. Parts (F) and (G) in FIG. 3 show the phase difference between C_REF and C_FB when the stage change is occurred. In summary, as shown in parts (D) to (G) in FIG. 3, the difference of the phase shift amount of the feedback clock signal C_FB between adjacent stages is Δ or smaller. Note that the phase difference of the feedback clock signal C_FB between the adjacent stages is $2\pi\Delta/(m \times n \times T\_OUT) = 2\pi/(Nr \times m \times n)$ radian.

As stated above, according to the PLL circuit 1, when the feedback clock signal C_FB is generated by dividing the frequency of the output clock signal C_OUT, the maximum value of the phase step width generated in the feedback clock signal C_FB to change the modulation degree of the output clock signal C_OUT can be suppressed to the basic delay amount Δ. Accordingly, the jitter of the output clock signal C_OUT as SSC can be suppressed, and the smooth transition of the modulation degree is made possible.

Figure 4:
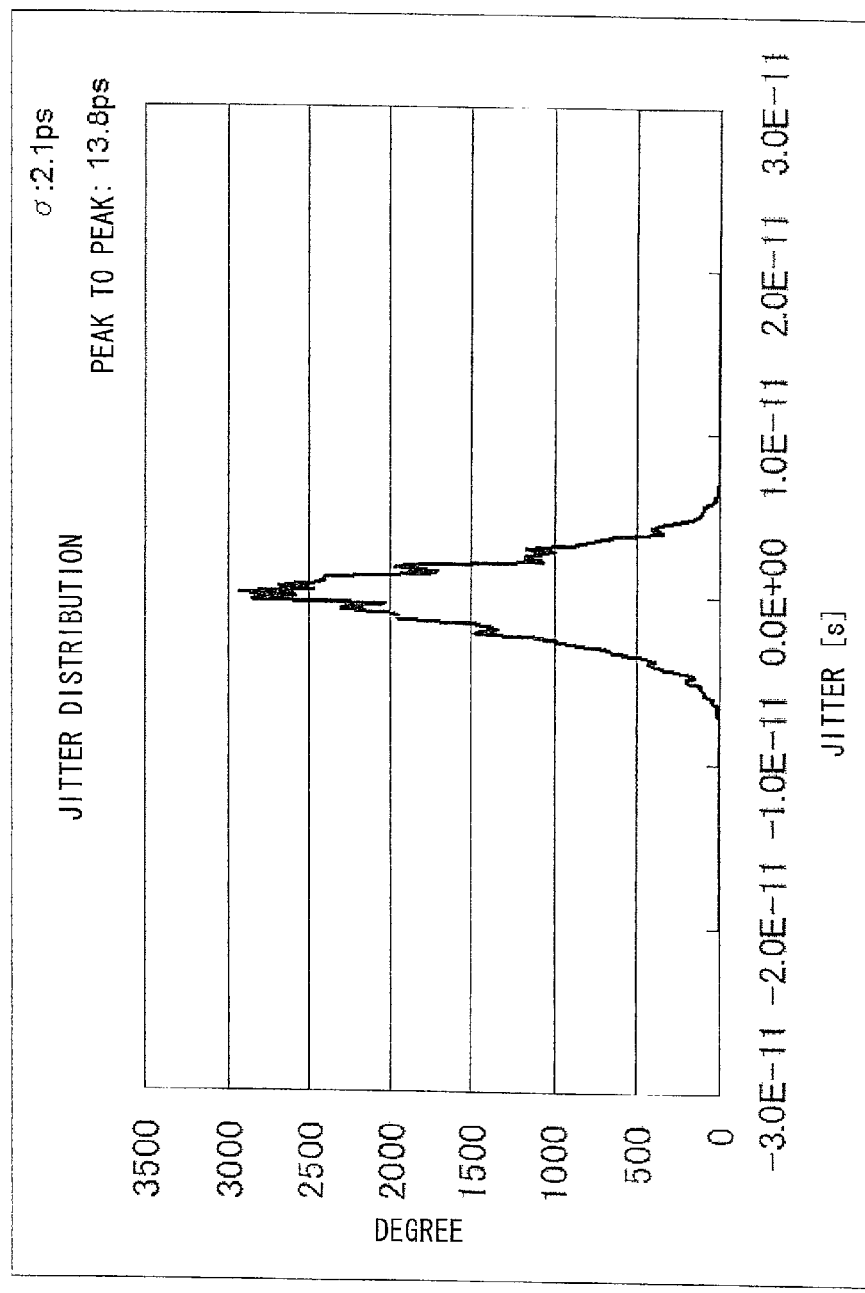
FIG. 4 is a graph showing a jitter distribution simulation result of an SSC generated by the PLL circuit shown in FIG. 1.

FIG. 4 is a graph showing a result of a jitter distribution simulation of the output clock signal C_OUT of the PLL circuit 1. The simulation condition is as follows.
  Reference clock frequency (F_REF): 30 MHz
  Total Frequency division number of frequency dividers 16 and 17 (m×n): 50
  Reference frequency of output clock (F_OUT0): 1.5 GHz
  Resolution of phase interpolator 15 (Nr): 64
  SSC modulation frequency (F_SSC): 32.15 kHz
  SSC maximum modulation degree (D_SSC): −2500 ppm The graph shown in FIG. 4 is the calculation result of the jitter component included in one period of the SSC, and shows a value after performing high-pass filter (−3 dB @2 MHz, −40 dB/dec) processing to remove low frequency component of the SSC modulation frequency as a jitter distribution. The result is that Peak-to-Peak jitter is about 13.8 ps. This value is close to the phase resolution (about 10.4 ps) of the phase interpolator 15.

Second Exemplary Embodiment

In the second exemplary embodiment, description will be made of the improvement of the phase shift control by the SSC 465 controller 18 described above. Note that the configuration of the PLL circuit according to the second exemplary embodiment may be similar to that of the PLL circuit 1 shown in FIG. 1. Accordingly, description and explanation of the whole block diagram of the PLL circuit according to the second exemplary embodiment will be omitted. In the following description, a configuration example and the operation of an SSC controller 28 included in the PLL circuit according to the second exemplary embodiment will be described.

Figure 5:
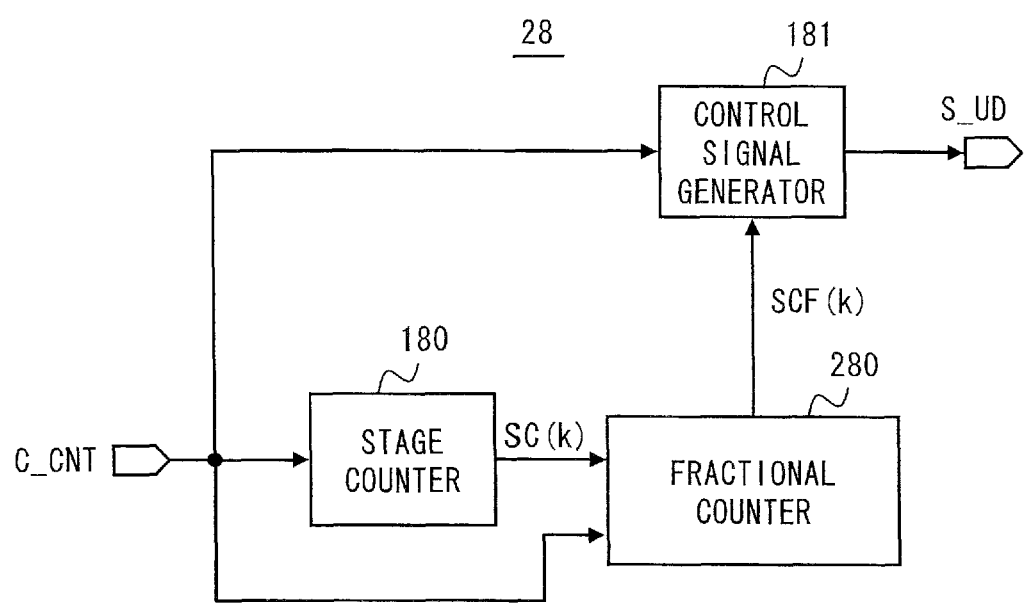
FIG. 5 shows a configuration example of an SSC controller included in a PLL circuit according to a second exemplary embodiment of the present invention.

FIG. 5 is a block diagram showing a configuration example of the SSC controller 28. The stage counter 180 and the control signal generator 181 shown in FIG. 5 are similar to those shown in FIG. 2. A fractional counter 280 is arranged between the stage counter 180 and the control signal 480 generator 181. The fractional counter 280 generates the fractional stage number SCF(k) in accordance with the stage number SC(k) supplied from the stage counter 180. The control signal generator 181 outputs the control signal S_UD showing the phase shift amount in accordance with the stage number designated by SCF(k).

Figure 6:
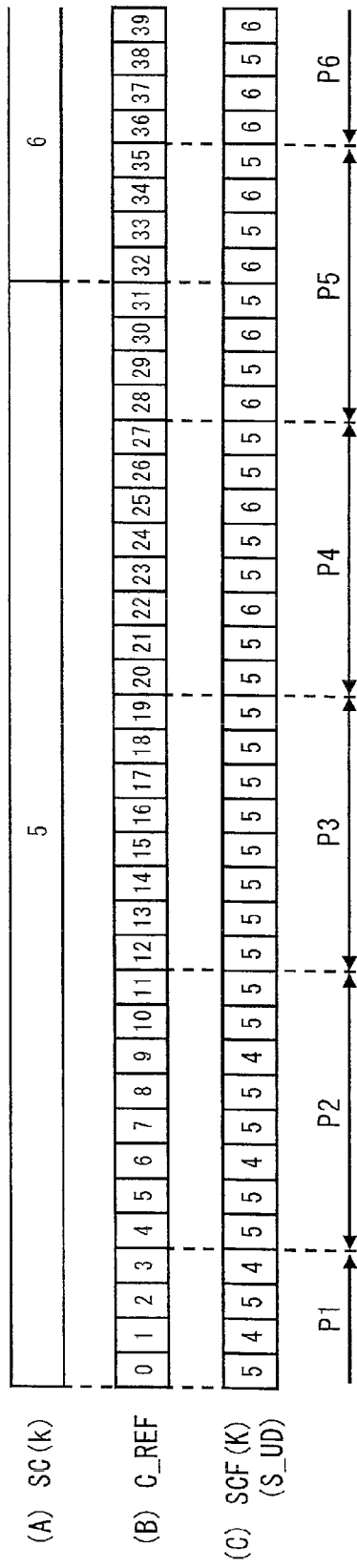
FIG. 6 shows a timing chart of the PLL circuit according to the second exemplary embodiment of the present invention.

The fractional counter 280 regularly changes the value of SCF(k) among SC(k−1), SC(k), and SC(k+1). A variation example of SCF(k) will be described with a timing chart of FIG. 6. In the example of FIG. 6, one stage corresponds to 32 periods of the reference clock period T_REF. Note that, as described in the first exemplary embodiment, a stage means a period in which one modulation degree is applied to the output clock signal C_OUT. In the example of FIG. 6, one stage is further divided into four sub-stages (part (C) in FIG. 6). Each sub-stage corresponds to eight periods of the reference clock period T_REF. Further, the sub-stage is set across stages at a boundary with the adjacent stage.

The fractional counter 280 changes a decision algorithm of SCF(k) for each sub-stage. For example, in a sub-stage P1 which is set across a fourth stage (not shown) and a fifth stage, SCF(5) includes a value SC(4) showing the fourth stage and a value SC(5) showing the fifth stage alternately with a ratio of 1:1. In the following sub-stage P2, the ratio of SC(4) to SC(5) included in SCF(5) is 1:3. In a sub-stage P3, SCF(5) only includes the value SC(5) showing the fifth stage. Further, in a sub-stage P4, the ratio of SC(5) to SC(6) included in SCF(5) is 3:1. In a sub-stage P5 which is set across the fifth stage and the sixth stage, SCF(5) includes a value SC(5) showing the fifth stage and a value SC(6) showing the sixth stage alternately with a ratio of 1:1.

As stated above, the SSC controller 28 regularly changes the stage number supplied to the control signal generator 181 between SC(k) and SC(k+1) around the switch point from the k-th stage to (k+1)-th stage. Accordingly, the phase shift amount applied to the phase shift signal C_PS is changed according to the stage number that is regularly changed. According to such a control, the average value of the phase shift amount that is regularly changed is reflected on the clock frequency of SSC, whereby the smooth transition of the modulation degree of SSC can further be made possible. For example, in FIG. 6, the phase step width between sub-stages is temporarily Δ/4.

Third Exemplary Embodiment

Figure 7:
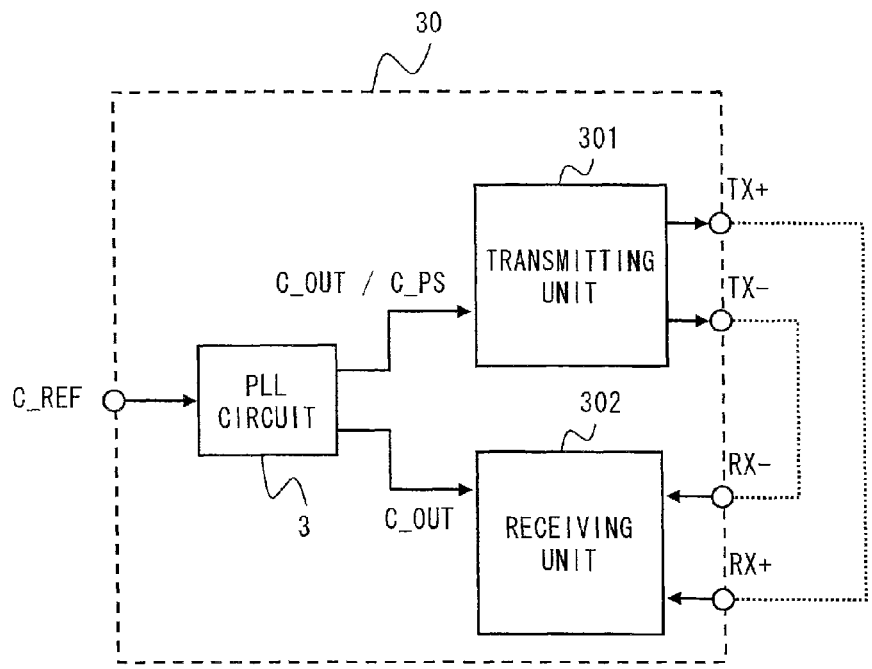
FIG. 7 is a block diagram of a communication device according to the third exemplary embodiment of the present invention.
Figure 8:
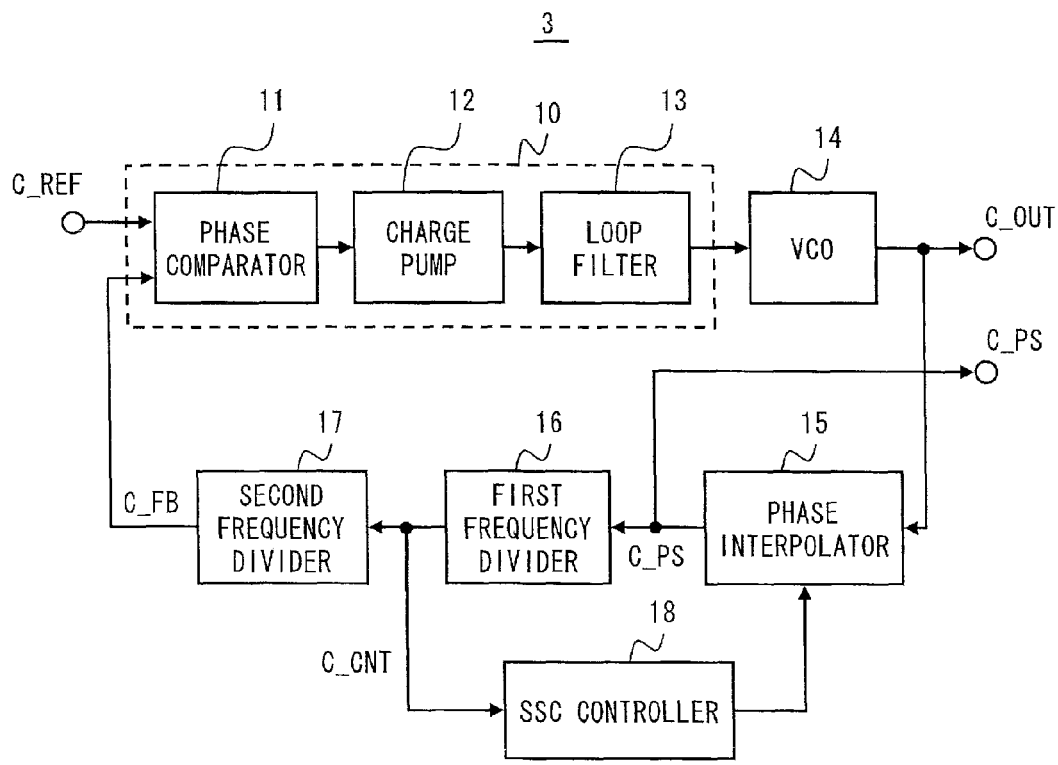
FIG. 8 is a block diagram of a PLL circuit included in the communication device shown in FIG. 7.

FIG. 7 shows the configuration of a communication device 30 according to the third exemplary embodiment. In FIG. 7, a PLL circuit 3 has the configuration similar to that of the PLL circuit 1 of the first exemplary embodiment described above. However, as shown in FIG. 8, the PLL circuit 3 includes a line and a terminal to supply the phase shift signal C_PS generated by the phase interpolator 15 to a transmitting unit 301.

The transmitting unit 301 transmits a data signal such as SATA (Serial ATA) or the like, for example. The transmitting unit 301 is arranged so as to be able to receive C_OUT and C_PS supplied from the PLL circuit 3, and is operated by any one of the two clock signals selectively supplied. The switching of the operational clock signal supplied to the transmitting unit 301 may be made possible, for example, by a switch, a jumper pin or the like operable from outside the communication device 30. Further, switching of the operational clock signal supplied to the transmitting unit 301 may be performed in accordance with a mode switch signal input from outside of the communication device 30. On the other hand, the receiving unit 302 receives the data signal such as SATA or the like, for example. The receiving unit 302 operates by C_OUT supplied from the PLL circuit 3. Note that shown in FIG. 7 is the transmitting unit 301 and the receiving unit 302 configured to transmit and receive differential signals. However, the transmitting unit 301 and the receiving unit 302 may transmit and receive single end signals.

Figure 9:
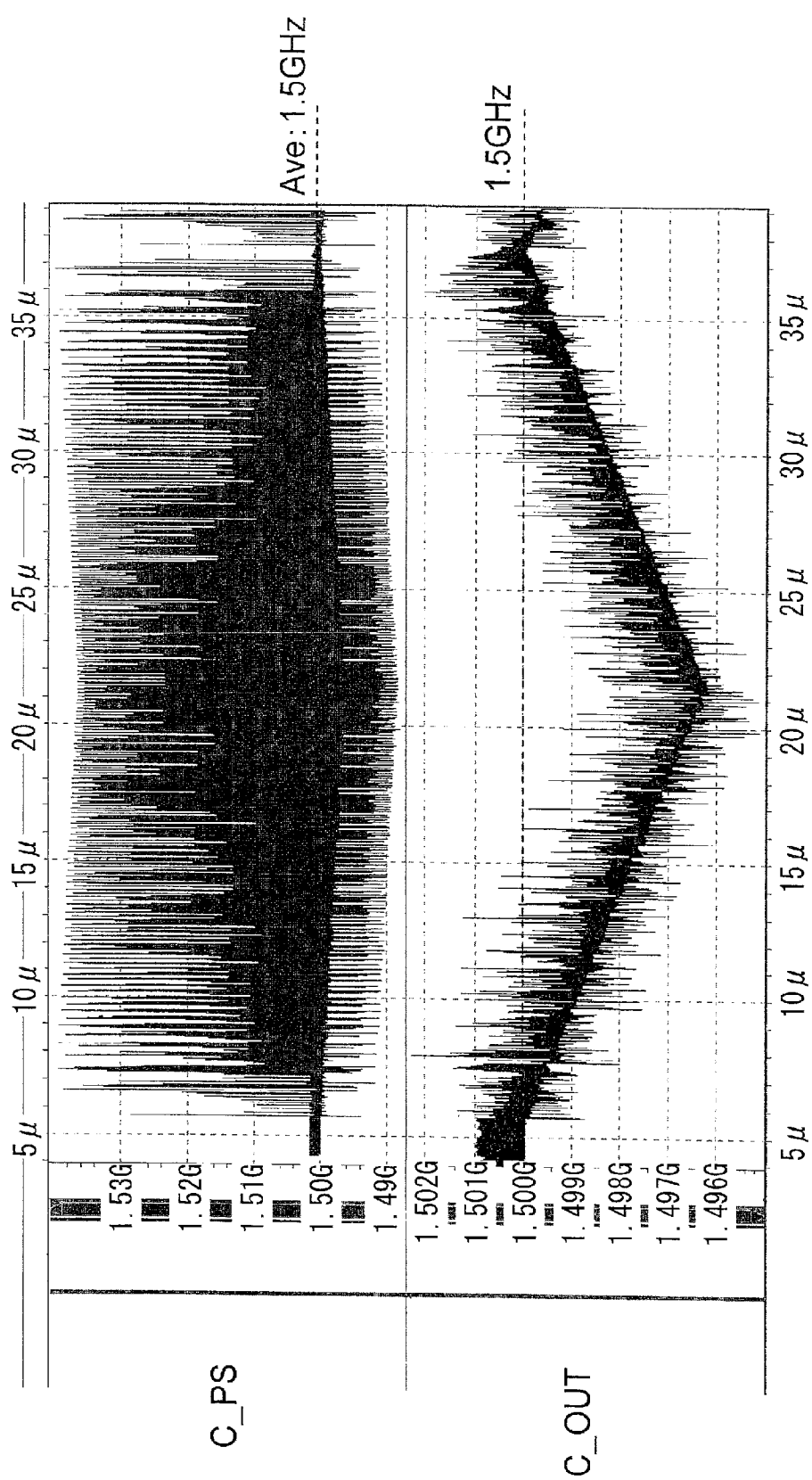
FIG. 9 is a waveform diagram of a clock signal output from the PLL circuit shown in FIG. 7.
Figure 10:
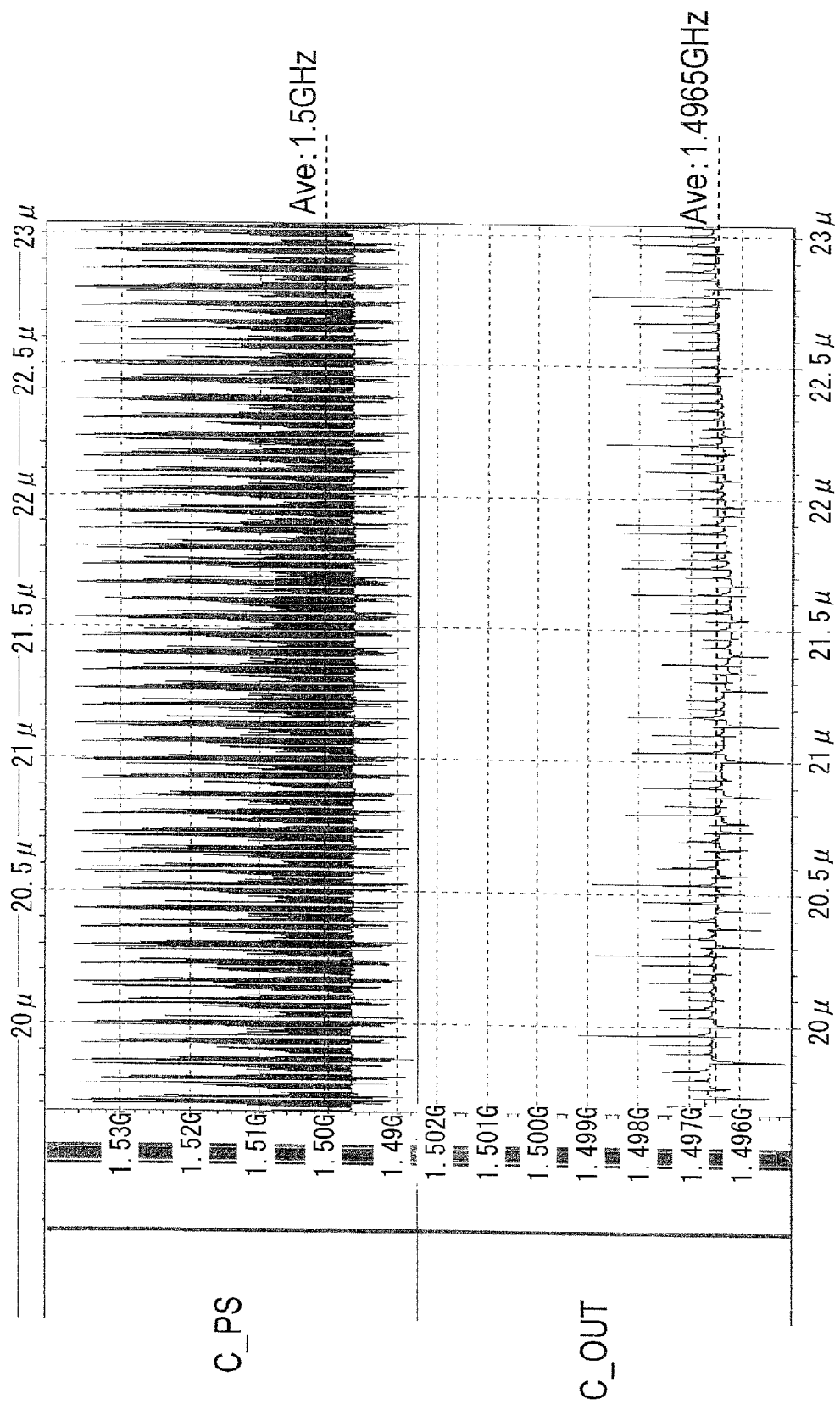
FIG. 10 is a waveform diagram of a clock signal output from the PLL circuit shown in FIG. 7.

FIGS. 9 and 10 show waveform diagrams of C_OUT and C_PS obtained by a circuit simulator. FIG. 10 is a waveform diagram obtained by enlarging a part around 21 microseconds of FIG. 9. As will be clear from FIGS. 9 and 10, while the frequency of C_OUT is modulated at a predetermined modulation period, the frequency of C_PS is not modulated, and an average frequency of C_PS is basically in the reference frequency F_OUT0 (1.5 GHz) of C_OUT. This is because, as the modulation degree of the output clock signal C_OUT in a negative direction is larger, the phase interpolator 15 greatly advances the phase of C_OUT to generate the phase shift signal C_PS. In other words, the phase shifting by the phase interpolator 15 operates to cancel the frequency fluctuation of the output clock signal C_OUT.

The operation mode to operate the transmitting unit 301 with the phase shift signal C_PS is effective in performing loopback test of the communication device 30. The communication device 30 performs the loopback test using a spread spectrum clock signal C_OUT and a non-spread spectrum clock signal C_PS that are concurrently generated.

The loopback test is performed by supplying the non-spread spectrum clock signal C_PS to the transmitting unit 301. On the other hand, the receiving unit 302 is operated by the spread spectrum clock signal C_OUT. Then, the output signal of the transmitting unit 301 is looped back to be received by the receiving unit 302.

If both of the transmitting unit 301 and the receiving unit 302 are operated with the spread spectrum signal C_OUT 580 in executing the loopback test, only the evaluation of the synchronous system where the operation clocks of the transmitting unit 301 and the receiving unit 302 have the same frequency can be made possible. On the other hand, the communication device 30 is able to operate the transmitting unit 301 with the non-spread spectrum clock signal C_PS. Therefore, the evaluation of the receiving unit 302 in an asynchronous system where the operation clock of the receiving unit 302 is not synchronized with that of the transmitting unit 301 can be easily performed.

It should be noted that a signal subjected to wave shaping by a low-pass filter or the like may be supplied to the transmitting unit 301, instead of supplying the phase shift signal C_PS itself.

By the way, the configuration that is newly employed in the communication device 30 shown in the third exemplary embodiment, which is the configuration for selectively supplying the spread spectrum output clock signal C_OUT or the phase shift signal C_PS output from the phase interpolator 15 to the transmitting unit 301, may be broadly applied to the communication device including the PLL circuit having the phase interpolator arranged in the PLL feedback path including the PLL circuit disclosed in the patent documents 2 and 3. In other words, the configuration that is newly employed in the communication device 30 may be applied to the communication device including the PLL circuit that does not control the phase shift amount described in the first and second exemplary embodiments of the present invention.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:
1. A communication device comprising:
a phase locked loop (PLL) circuit that comprises:
(a) a phase comparing unit that receives a reference clock signal and a feedback clock signal and generates a control voltage in accordance with a phase difference between the reference clock signal and the feedback clock signal;
(b) a voltage controlled oscillator that oscillates at an oscillation frequency in accordance with the control voltage and generates a spectrum-modulated output clock signal;
(c) a phase interpolator that receives the spectrum-modulated output clock signal and generates a phase-shifted signal obtained by shifting phase of the spectrum-modulated output clock signal;
(d) a feedback path that supplies the phase-shifted signal or a signal obtained by dividing frequency of the phase-shifted signal to the phase comparing unit as the feedback clock signal; and
(e) a controlling unit that periodically changes a modulation degree of the spectrum-modulated output clock signal by controlling the phase interpolator to change a phase shift amount at timings predetermined in accordance with a spread spectrum clock (SSC) modulation profile;
a signal receiving unit that operates upon receiving supply of the spectrum-modulated output clock signal; and
a signal transmitting unit that is capable of receiving both of the spectrum-modulated output clock signal and the phase-shifted signal or a shaped clock signal which is obtained by shaping a waveform of the phase-shifted signal, the signal transmitting unit being operated by the spectrum-modulated output clock signal, or the phase-shifted signal or the shaped clock signal that is selectively supplied.

2. The communication device according to claim 1, wherein the signal transmitting unit is configured to transmit an information signal after being operated by the phase-shifted signal or by the shaped clock signal, and
the information signal is looped back from the signal transmitting unit to the signal receiving unit to input the information signal to the signal receiving unit.

3. The communication device according to claim 1, wherein the phase interpolator generates a phase-shifted signal obtained by shifting phase of the spectrum-modulated output clock signal by a phase shift amount selected from plurality of phase shift amounts mutually different by integral multiple of a basic delay amount.

4. The communication device according to claim 1, wherein the controlling unit controls a total phase shift amount applied to the phase-shifted signal in one period of the feedback clock signal in a way that a difference between the total phase shift amount and a total phase shift amount in a previous one period of the feedback clock signal is always equal to or less than one basic delay amount.

5. The communication device according to claim 1, wherein the modulation profile of the SSC includes a modulation frequency.

6. The communication device according to claim 1, wherein the modulation profile of the SSC includes a maximum modulation degree.

7. The communication device according to claim 1, wherein the phase comparing unit includes a phase comparator, a charge pump, and a loop filter.

8. The communication device according to claim 7, wherein the phase comparator may be a phase and frequency comparator.

9. The communication device according to claim 2, wherein the information signal is a differential signal.

10. The communication device according to claim 9, wherein the differential signal is a Serial ATA (SATA) signal.

11. The communication device according to claim 1,
wherein the controlling unit controls a total phase shift amount applied to the phase-shifted signal in one period of the feedback clock signal in a way that a difference between the total phase shift amount and a total phase shift amount in a previous one period of the feedback clock signal is always equal to or less than one basic delay amount, and
wherein the controlling unit regularly increases or decreases the total phase shift amount applied to the phase-shifted signal in one period of the feedback clock between a first phase shift amount and a second phase shift amount in switching a modulation degree of the spectrum-modulated output clock signal from a first modulation degree to a second modulation degree, the first modulation degree being defined by the first phase shift amount corresponding to k basic delay amounts, and the second modulation degree being defined by the second phase shift amount corresponding to k+1 basic delay amounts.

12. The communication device according to claim 1, wherein the PLL circuit is configured to concurrently generate and to output the spectrum-modulated output clock signal and the phase-shifted signal or the shaped clock signal.

13. The communication device according to claim 12, wherein the PLL circuit is configured to concurrently output one of the spectrum-modulated output clock signal and the phase-shifted signal or the shaped clock signal to the transmitting unit, and the spectrum-modulated output clock signal to the receiving unit.

* * * * *